United States Patent
Rivera-Marty

(10) Patent No.: US 10,199,312 B1
(45) Date of Patent: Feb. 5, 2019

(54) METHOD OF FORMING A PACKAGED SEMICONDUCTOR DEVICE HAVING ENHANCED WETTABLE FLANK AND STRUCTURE

(71) Applicant: Amkor Technology, Inc., Tempe, AZ (US)

(72) Inventor: Pedro Joel Rivera-Marty, Chandler, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/700,101

(22) Filed: Sep. 9, 2017

(51) Int. Cl.
*H01L 23/495* (2006.01)
*H01L 23/498* (2006.01)
*H01L 23/31* (2006.01)
*H01L 23/00* (2006.01)

(52) U.S. Cl.
CPC .... *H01L 23/49541* (2013.01); *H01L 23/3114* (2013.01); *H01L 23/49838* (2013.01); *H01L 24/16* (2013.01); *H01L 24/81* (2013.01); *H01L 24/97* (2013.01); *H01L 2924/18161* (2013.01)

(58) Field of Classification Search
CPC .. H01L 23/49541; H01L 23/49551–23/49555; H01L 23/4951; H01L 23/49548; H01L 24/81; H01L 24/97; H01L 24/16; H01L 23/3114; H01L 23/49838; H01L 2924/18161

See application file for complete search history.

(56) References Cited

U.S. PATENT DOCUMENTS

| 5,157,475 A | * | 10/1992 | Yamaguchi | H01L 21/56 257/679 |
| 6,608,366 B1 | | 8/2003 | Fogelson et al. | |
| 6,650,012 B1 | * | 11/2003 | Takahashi | H01L 21/4832 257/666 |
| 6,696,747 B1 | | 2/2004 | Lee et al. | |

(Continued)

OTHER PUBLICATIONS

Pending U.S. Appl. No. 15/460,032, by Yeo Siang Miang et al., entitled "Method of Forming a Packaged Semiconductor Device Using Ganged Conductive Connective Assembly and Structure", filed Mar. 15, 2017, Assignee: Amkor Technology Inc., 23 pages specification, 6 pages drawings.

*Primary Examiner* — Victor A Mandala
(74) *Attorney, Agent, or Firm* — Kevin B. Jackson

(57) ABSTRACT

A packaged electronic device includes a substrate having a lead. The lead includes an outward facing side surface having a first height, and an inward facing side surface having a second height that is less than the first height. An electronic device is electrically connected to the lead. A package body encapsulates the electronic device and portions of the lead. The outward facing side surface is exposed through a side surface of the package body, and the inward facing side surface is encapsulated by the package body. A conductive layer is disposed on the outward facing side surface to provide the packaged electronic device with an enhanced wettable flank. In one embodiment, the electronic device is electrically connected to a thick terminal portion having the outward facing side surface. In another embodiment, the electronic device is electrically connected to a thin terminal portion having the inward facing side surface.

20 Claims, 14 Drawing Sheets

(56) References Cited

U.S. PATENT DOCUMENTS

| | | | |
|---|---|---|---|
| 6,730,544 B1 * | 5/2004 | Yang | H01L 23/3107 257/678 |
| 7,023,074 B2 * | 4/2006 | Li | H01L 23/3107 257/666 |
| 7,405,104 B2 * | 7/2008 | Minamio | H01L 21/565 257/E21.504 |
| 7,425,755 B2 * | 9/2008 | Liu | H01L 23/49551 257/666 |
| 8,120,149 B2 * | 2/2012 | Camacho | H01L 23/4951 257/676 |
| 9,177,836 B1 * | 11/2015 | Liu | H01L 21/565 |
| 2004/0089921 A1 * | 5/2004 | Minamio | H01L 21/565 257/666 |
| 2005/0269696 A1 | 12/2005 | Ochiai | |
| 2010/0221872 A1 * | 9/2010 | Islam | H01L 21/4832 438/124 |
| 2011/0244629 A1 * | 10/2011 | Gong | H01L 21/4828 438/112 |
| 2012/0306065 A1 * | 12/2012 | Bin Mohd Arshad | H01L 23/49548 257/676 |
| 2013/0049179 A1 * | 2/2013 | Desai | H01L 23/3128 257/666 |
| 2013/0264710 A1 * | 10/2013 | Osugi | H01L 27/0814 257/741 |
| 2014/0035113 A1 * | 2/2014 | Kierse | H01L 23/49541 257/676 |
| 2014/0151865 A1 * | 6/2014 | Koschmieder | H01L 23/49551 257/676 |
| 2016/0056097 A1 * | 2/2016 | Bai | H01L 23/49582 257/670 |
| 2016/0181180 A1 * | 6/2016 | Lohia | H01L 23/49575 257/676 |
| 2016/0190095 A1 * | 6/2016 | Celaya | H01L 23/49541 438/112 |
| 2016/0254214 A1 * | 9/2016 | Makino | H01L 24/97 257/676 |
| 2016/0379916 A1 * | 12/2016 | Talledo | H01L 23/49544 257/676 |
| 2017/0278776 A1 * | 9/2017 | Milo | H01L 21/4853 |
| 2017/0294367 A1 * | 10/2017 | Kitnarong | H01L 21/288 |
| 2017/0338170 A1 * | 11/2017 | Ziglioli | H01L 23/49582 |
| 2018/0130767 A1 * | 5/2018 | Talledo | H01L 23/49544 |
| 2018/0158770 A1 * | 6/2018 | Lin | H01L 23/13 |

* cited by examiner

METHOD OF FORMING A PACKAGED SEMICONDUCTOR DEVICE HAVING ENHANCED WETTABLE FLANK AND STRUCTURE

CROSS-REFERENCE TO RELATED APPLICATIONS

Not Applicable.

BACKGROUND OF THE DISCLOSURE

The present invention relates, in general, to electronics, and more particularly, to semiconductor packages, structures thereof, and methods of forming semiconductor packages.

In the past, semiconductor packages, such as Plastic Quad Flat Pack No-lead (PQFN) or Quad Flat Pack No-Lead Exposed Pad (QFN-EP) packages have not had easily solderable, visually exposed terminations, because the package designs had terminations on the underside of the semiconductor package for solder joints. The terminations on the edges of such semiconductor packages, which were exposed after singulation, consisted of exposed copper. The exposed copper did not easily solder wet because of copper oxidation. Thus, visual determination that the semiconductor package had soldered effectively to a next level of assembly, such as a printed circuit board, could not be made by optical viewing. Electrical test was the only way to determine electrical connectivity of the soldered terminations. There are some applications where full electrical test of all terminations is difficult or incomplete. Thus, in high reliability applications, such as automotive applications, it has been desired to visually check for termination solder joint integrity. It is for these purposes that wettable flanks, which are solder plated terminations of semiconductor packages, have been developed as a visual aid for the determination of solder operation effectiveness.

Wettable flank plating is an additional process step that deposits a solderable conductive material, such as tin, with a normal conductive material thickness, on the semiconductor package underside terminals and on the exposed edge terminations or flanks. The wettable flank plating protects the copper and allows soldering to occur on this external flank area of the terminations such that optical inspection can be made verifying a good solder fillet joint, and thus a good electrical connection. Although progress has been made in wettable flank processes, improvements in conductive substrate structures and methods of forming such structures are needed to further enhance wettable flanks.

Accordingly, it is desirable to have a method and a structure that provides a packaged semiconductor device that improves the wettable surface coverage for side or flank surfaces of a conductive substrate. It is also desirable for the structure and method to be easily incorporated into manufacturing flows, accommodate multiple die interconnect schemes, and to be cost effective.

BRIEF SUMMARY

The present description includes, among other features, a packaged electronic device structure and associated method include a lead structure having an exposed side surface or flank surface having an increased height compared to related devices. The exposed side surface provides an enhanced wettable flank surface that improves the bond integrity when the packaged electronic device is attached to a next level of assembly, such as a printed circuit board. In addition, the increased height enhances optical inspection of solder joints formed between the packaged electronic device and the next level of assembly. The structure and method provide for improved reliability by facilitating stronger solder joints compared to previous approaches. The structure and method are suitable for packaged semiconductor devices and other electronic devices having exposed flank or side surfaces configured for subsequent deposition of solderable materials, including, but not limited to, power semiconductor devices. The lead structure can be provided as part of, for example, a lead frame substrate, a build-up substrate, or a molded substrate.

More particularly, in one embodiment, a packaged electronic device includes a substrate having a lead. The lead includes an outward facing side surface having a first height, and an inward facing side surface having a second height that is less than the first height. An electronic device is electrically connected to the lead. A package body encapsulates the electronic device and portions of the lead. The outward facing side surface is exposed through a side surface of the package body, and the inward facing side surface is encapsulated by the package body. A conductive layer is disposed on the outward facing side surface to provide the packaged electronic device with an enhanced wettable flank. In one embodiment, the electronic device is electrically connected to a thick terminal portion having the outward facing side surface. In another embodiment, the electronic device is electrically connected to a thin terminal portion having the inward facing side surface. In a further embodiment, the lead has a first terminal portion having a thickness greater than or equal to about 250 microns.

In another embodiment, a packaged electronic device includes a substrate. The substrate includes a lead that includes a first terminal portion having a first thickness and an outward facing side surface, and a second terminal portion having an inward facing side surface having a second thickness less than the first thickness. The substrate further includes a pad. The second terminal portion is proximate to the pad and the first terminal portion is distal to the pad. An electronic device is electrically connected to the lead. A package body encapsulates the electronic device and portions of the lead and pad such that the outward facing side surface is exposed through a side surface of the package body, and the inward facing side surface is encapsulated by the package body. A conductive layer is disposed on the outward facing side surface.

In a further embodiment, a method for forming a packaged electronic device includes providing a substrate. The substrate includes a lead having a first terminal portion having a first thickness, and a second terminal portion having an inward facing side surface having a second thickness that is less than the first thickness. The method includes electrically connecting an electronic device to the lead. The method includes providing a package body encapsulating the electronic device and portions of the lead and pad. The method includes removing a first portion of the first terminal portion to provide an outward facing side surface of the lead. The method includes forming a conductive layer on the outward facing side surface of the lead. The method includes singulating a second portion of the first terminal portion.

In one embodiment, providing the substrate includes providing a conductive substrate having a first major surface and a second major surface opposite to the first major surface, wherein the conductive substrate has the first thickness; forming a first recessed surface extending from a first portion the first major surface into the conductive substrate while leaving a second portion of the first major surface at the first thickness, wherein the first recessed surface defines the second thickness of the second terminal portion and the second portion defines the first thickness of the first terminal portion; and removing portions of the conductive substrate from the first recessed surface and the second major surface to define the first terminal portion, the second terminal portion, and the pad, wherein removing portions of the conductive substrate from the second surface provides the inward facing side surface comprising an inward facing recessed side surface.

In another embodiment, providing the substrate comprises providing a carrier having a first major surface and a second major surface opposite to the first major surface; providing a conductive pattern on the first major surface; and providing a conductive pillar on a first portion of the conductive pattern but not on a second portion of the conductive pattern, wherein the conductive pillar and the first portion of conductive pattern provide the first terminal portion and the second portion of the conductive pattern provides the second terminal portion.

In a further embodiment, providing the substrate comprises providing the conductive pattern with a third portion; the method further comprises attaching the electronic device to the third portion; and the method further comprises removing the carrier after forming the package body.

In a still further embodiment, providing the substrate comprises providing the conductive pattern with a third portion; the method further comprises forming a molded layer covering portions of the conductive pillar and the first, second, and third portions of the conductive pattern; the method further comprises removing the carrier before electrically connecting the electronic device to the lead to expose the conductive pattern to the outside of the molded layer; and the method further comprises electrically connecting the electronic device to the third portion.

Figure 1:
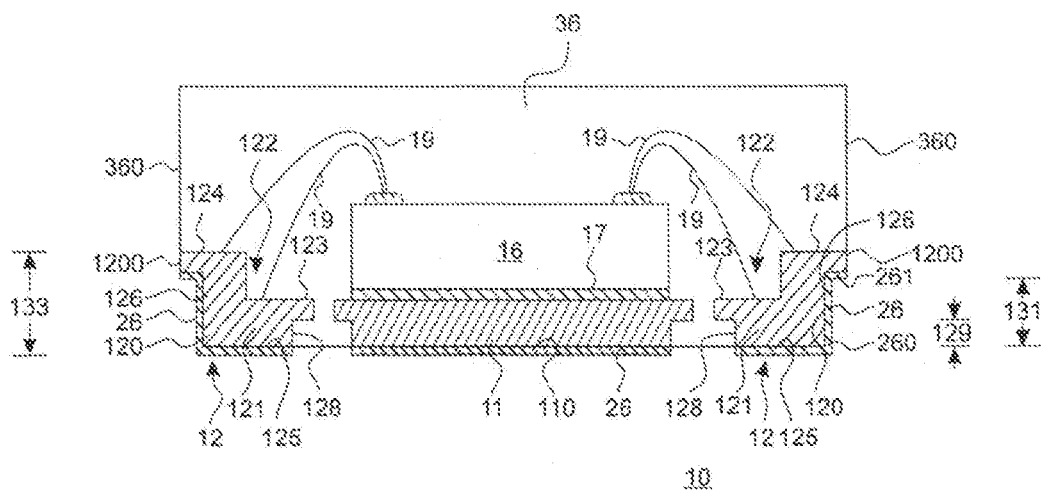
FIG. 1 illustrates a cross-sectional view of a packaged electronic device in accordance with an embodiment of the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

FIG. 1 illustrates a cross-sectional view of a packaged electronic device 10, such as a packaged semiconductor device 10 in accordance with a first embodiment. In accordance with the present embodiment, packaged semiconductor device 10 includes a pad 11, flag 11, die attach pad 11, die pad 11, or support pad 11 and leads 12 or terminals 12 disposed proximate to, but separated from, pad 11. In one embodiment, an electronic device 16, electronic component 16, or electronic die 16, such as a semiconductor device 16 or semiconductor die 16 is connected to or attached to pad 11 using an attach material 17. In some embodiments, semiconductor device 16 is an integrated circuit device, a power semiconductor device, an optical device, a sensor device, or other devices as known to those skilled in the art. By way of example, attach material 17 can be a solder paste, a conductive epoxy, conductive adhesives, conductive films, non-conductive epoxy, non-conductive adhesives, non-conductive films, or other suitable attach materials as known to those skilled in the art. In some embodiments, non-conductive refers to electrically insulating and it is understood that such materials may still be thermally conductive. Those skilled in the art will appreciate that electronic device 16 is illustrated in simplified form, and may further include multiple diffused regions, multiple conductive layers, and multiple dielectric layers.

In accordance with the present embodiment, leads 12 comprise a unique shape compared to related devices. As illustrated in FIG. 1, one or more leads 12 include a thick terminal portion 120 or thick lead portion 120, and a thin terminal portion 121 or thin lead portion 121. Stated differently, thick terminal portion 120 has a greater thickness or height compared to thin terminal portion 121 in cross-sectional view to provide a shelf portion 122 or step portion 122. In accordance with the present embodiment, thick terminal portion 120 is disposed distal to pad 11 and thin terminal portion 121 is disposed proximate to pad 11. In one embodiment, thick terminal portion 120 laterally abuts thin terminal portion 121, with thin terminal portion 121 interposed between thick terminal portion 120 and pad 11. In the present embodiment, thick terminal portion 120 includes an outward facing side surface 126, conductive side surface 126, outward facing flank surface 126, or flank surface 126 that is configured for receiving a conductive layer 26. In some embodiments, flank surface 126 is laterally recessed inward as generally illustrated in FIG. 1 and can be described as outward facing recessed side surface 126. In this embodiment, conductive layer 26 includes a vertical portion 260 and a horizontal portion 261. Horizontal portion 261 can be at least partially arcuate instead of straight or linear, such as in cases where etching is used instead of sawing to form outward facing flank surface 126. In most embodiments, conductive layer 26 is further disposed adjacent a bottom facing surface 125 or lower surface 125 of leads 12. In accordance with the present embodiment, thick terminal portion 120 includes a portion 1200 or outward facing portion 1200 that does not include conductive layer 26. In accordance with the present embodiment, portions 1200 are absent conductive material 26 because portions 1200 are exposed or formed after conductive layer 26 is formed.

In some embodiments, thin terminal portion 121 includes an inward facing side surface 128 that laterally opposes outward facing side surface 126 in cross-sectional view. In some embodiments, inward facing side surface 128 is laterally recessed inward as generally illustrated in FIG. 1 and can be described as inward facing recessed side surface 128. By way of example, inward facing side surface 128 and outward facing side surface 126 can be laterally recessed up to about 60 microns. In other embodiments, inward facing side surface 128 is not recessed.

In accordance with the present embodiment, inward facing side surface 128 has a height 129 or thickness 129 that is less than a height 131 or thickness 131 of outward facing side surface 126. In some embodiments, height 131 is greater than about 140 microns and height 129 is less than about 130 microns. By way of example, height 131 is in a range from about 140 microns through about 200 microns or more. In the same or other embodiments, height 131 can be at least approximately 10% greater than height 129 or more, such as approximately 50% greater than height 129. In accordance with the present embodiment, the total height 133 or thickness 133 of thick terminal portion 120 can be up to about 250 microns or more, which is different from previous devices that have leads with a standard full thickness of less than 200 microns. This difference provides flank surface 126 with a taller surface or increased surface area compared to prior devices having flank surfaces less than 130 microns in height. In accordance with the present embodiment, the taller flank surface 126 provides more solderable surface area for attaching packaged electronic device 10 to a next level of assembly, which improves bond integrity and reliability. In addition, this enhances the ability to perform any necessary visual inspections of the bonded surfaces.

Packaged electronic device 10 further includes conductive connective structures 19 attached to a major surface of semiconductor device 16 and further connected to one or more leads 12. In some embodiments, one or more or all of conductive connective structures 19 are attached to top surfaces 123 of thin terminal portion 121. In other embodiments, one or more or all of conductive connective structures 19 are attached to top surfaces 124 of thick terminal portion 120. In some embodiments, it is preferred to attach conductive connective structures 19 to top surfaces 124 because top surfaces 124 are not etched surfaces, which can provide a more reliable surface for attaching conductive connective structures 19. In other embodiments, it is preferred to attach conductive connective structures 19 to top surfaces 123 of thin terminal portions 121 to support a thinner package body. By way of example, conductive connective structures 19 comprise gold or copper wires or other materials as known to those skilled in the art. It is understood that other conductive connective structures, such as clips, ribbon bonds, or other structures known to those skilled in the art can be used instead of, or in addition to, the conductive wires. In addition, direct chip attachment methods can be used, which will be illustrated, for example, with FIG. 3.

Packaged electronic device 10 further includes a package body 36 that covers or encapsulates conductive connective structures 19, semiconductor die 16, at least portions of leads 12, and at least portions of pad 11 while, in some embodiments, leaving lower or bottom surfaces 125 of leads 12, flank surfaces 126 of leads 12, and lower surface 110 of pad 11 exposed to the outside of packaged electronic device 10 as generally illustrated in FIG. 1. In some embodiments, package body 36 can be polymer based composite material, such as epoxy resin with filler, epoxy acrylate with filler, or polymer with proper filler. Package body 36 comprises a non-conductive and environmentally protective material that protects electronic device 16 from external elements and contaminants. Package body 36 may be formed using paste printing, compressive molding, transfer molding, overmolding, liquid encapsulant molding, vacuum lamination, other suitable applicator, or other processes as known to those of skill in the art. In some embodiments, package body 36 is an epoxy mold compound ("EMC"), and can be formed using transfer or injection molding techniques.

In accordance with the present embodiment, conductive side surfaces 126 or outward facing flank surfaces 126 are exposed through side surfaces 360 of package body 36, and are further covered by conductive layer 26, which can be a solderable layer 26. By way of example, conductive layer 26 comprises tin (Sn) and can be formed using plating techniques. In some embodiments, conductive layer 26 is further disposed on lower surfaces 125 of leads 12 and on lower surface 110 of pad 11 as generally illustrated in FIG. 1. In other embodiments, lower surface 110 may not be exposed to the outside of packaged electronic device 10.

Figure 2:
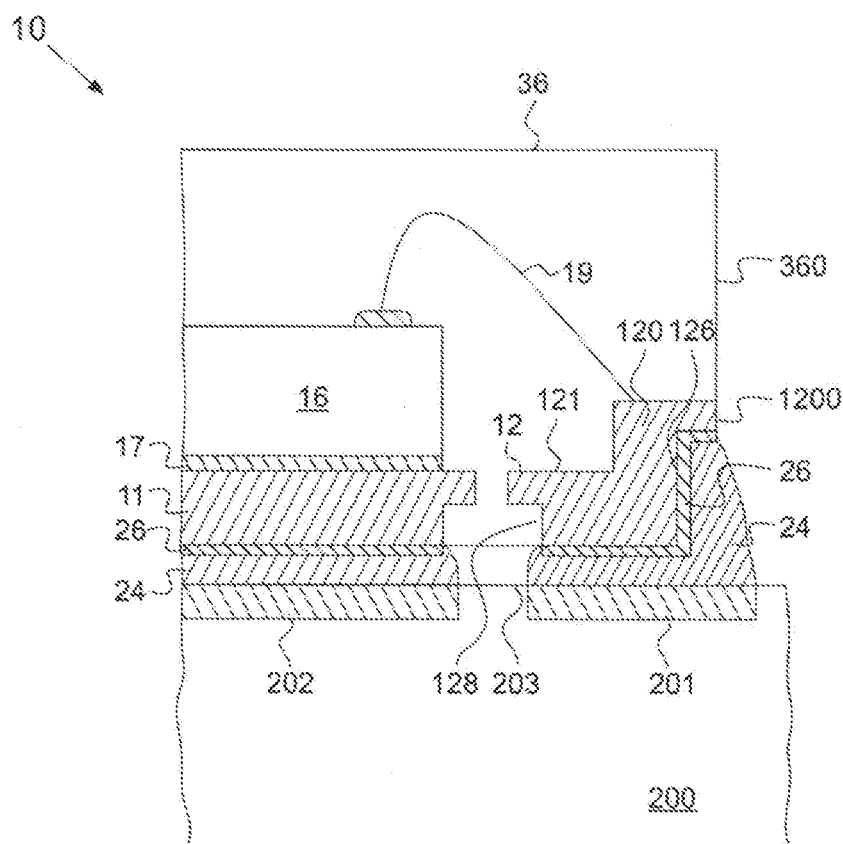
FIG. 2 illustrates a partial cross-sectional view of the packaged electronic device of FIG. 1 attached to a next level assembly in accordance with the present description.

FIG. 2 illustrates a partial cross-sectional view of a portion of packaged electronic device 10 attached to a next level of assembly 200, such as a printed circuit board 200 having a conductive traces 201 and 202 disposed proximate to a first surface 203. In accordance with the present embodiment, outward facing flank surface 126 of lead 12 has about 55% more surface area for conductive layer 26 compared to related devices, which provides about a 55% increase in wettable flank surface area for solder attach material 24. In accordance with the present embodiment, this improves the solder joint strength and the reliability of the assembled component compared to related devices. In addition, this enhances the ability to perform any necessary visual inspections of the bonded surfaces.

Figure 3:
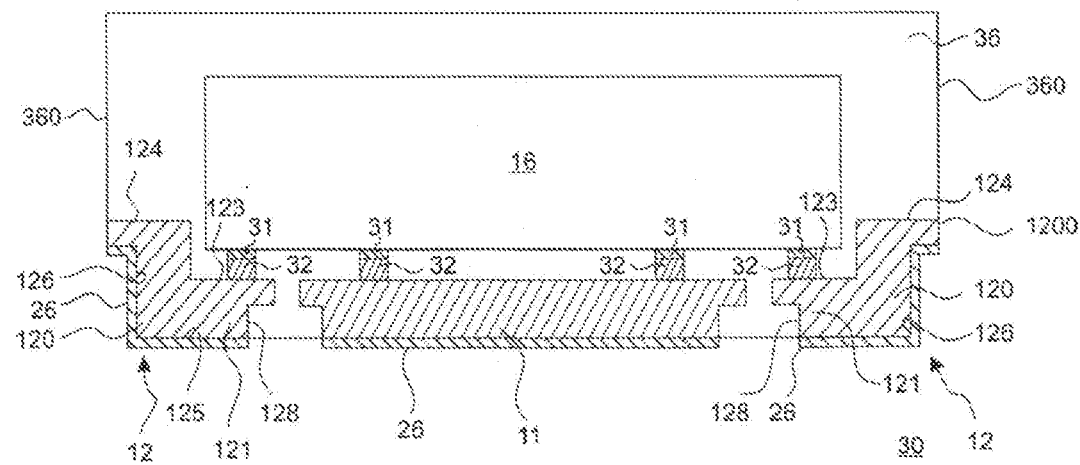
FIG. 3 illustrates a cross-sectional view of a packaged electronic device in accordance with an embodiment of the present description.

FIG. 3 illustrates a cross-sectional view of a packaged electronic device 30, such as a packaged semiconductor device 30 in accordance with another embodiment. Packaged electronic device 30 is similar to packaged electronic device 10 and only the differences will be described hereinafter. In packaged electronic device 30, electronic device 16, such as semiconductor device 16 is directly attached to leads 12 and pad 11 in a flip-chip configuration. In some embodiments, conductive bumps 31 are used to attach electronic device 16 to leads 12 and pad 11. In some embodiments, conductive bumps 31 comprise temperature reflowed solder bumps and/or pillar bumps (e.g., copper pillar bumps that can have corresponding solder tips), thermosonic or thermocompression bonded bumps (e.g., gold bumps), adhesively bonded bumps, or other bump materials known to those skilled in the art. In some embodiments, conductive bumps 31 are first applied to bond pads 32 on electronic device 16 while in wafer form. In one embodiment, electronic device 16 is directly attached to top surfaces 123 of thin terminal portions 121. In other embodiments, electronic device 16 can be directly attached to top surfaces 124 of thick terminal portions 120. In some embodiments, package body 36 provides an underfill structure for electronic device 16. In additional embodiments, a separate underfill material can be used and formed prior to forming package body 36.

Figure 4:
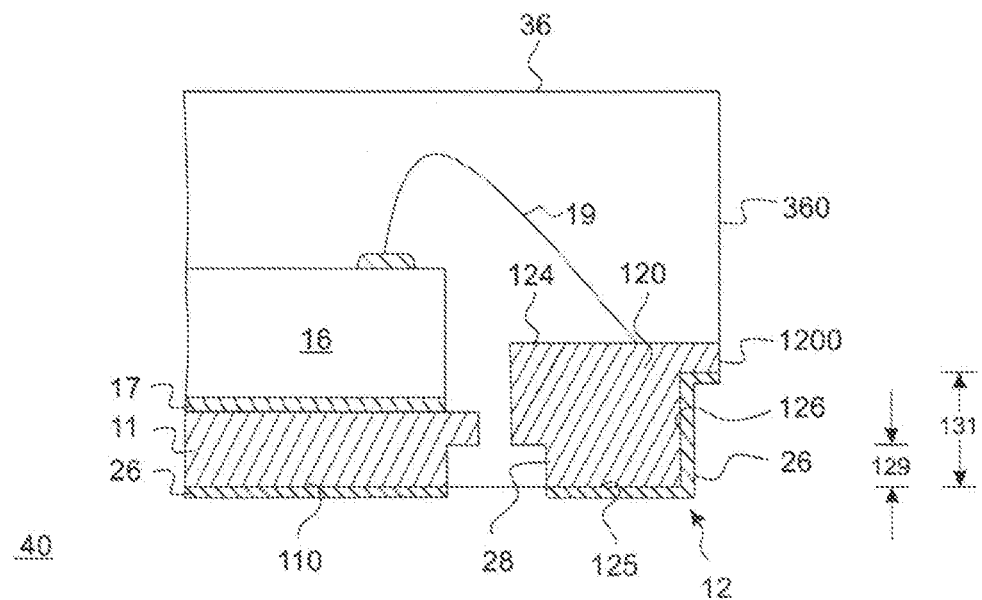
FIG. 4 illustrates a partial cross-sectional view of a packaged electronic device in accordance with an embodiment of the present description.

FIG. 4 illustrates a partial cross-sectional view of a packaged electronic device 40, such as a packaged semiconductor device 40 in accordance with a further embodiment. Packaged electronic device 40 is similar to packaged electronic device 10 and only the differences will be described hereinafter. In packaged electronic device 40, a different configuration of lead 12 is provided. In packaged electronic device 40 lead 12 does not have a thin terminal portion 121, but instead consists of a thick terminal portion 120 only. In this configuration, lead 12 still includes outward facing recessed flank surface 126 and inward facing recessed side surface 128 that laterally opposes outward facing flank surface 126 in cross-sectional view. In accordance with the present embodiment, outward facing flank surface 126 has height 131 greater than the height 129 of inward facing side surface 128 as described with packaged electronic device 10. In the present embodiment, conductive connective structures 19 are attached to top surface 124 of thick terminal portion 120 as generally illustrated in FIG. 4.

Figure 5:
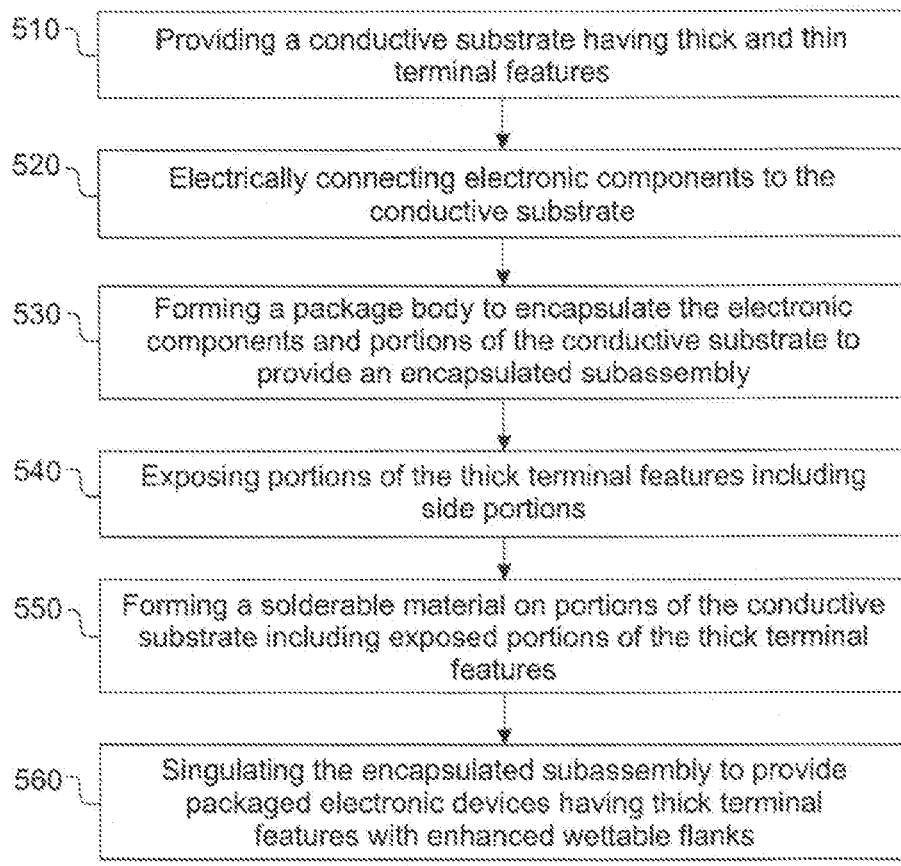
FIG. 5 is a flow chart of a method of manufacturing a packaged electronic device in accordance with an embodiment of the present description.

FIG. 5 is a flow chart of a method of manufacturing a packaged electronic device, such as packaged electronic device 10 in accordance with one embodiment. The method includes a step 510 of providing a conductive substrate having thick and thin terminal features. By way example, this can include thick terminal portions 120 and thin terminal portions 121 illustrated in FIG. 1. Stated a different way, step 510 can include providing a conductive substrate having an outward facing recessed side surface and an opposing inward facing recessed side surface that has a smaller height than the outward facing recessed side surface, such as in the embodiment illustrated in FIG. 4. The method includes a step 520 of electrically connecting electronic components to the conductive substrate. In some embodiments, the electronic components can include one or more electronic devices 16, such as semiconductor devices 16. The method includes a step 530 of forming a package body to encapsulate the electronic components and portions of the conductive substrate to provide an encapsulated subassembly. In some embodiments, the package body can include package body 36.

The method includes a step 540 of exposing portions of the thick terminal features including side portions of the thick terminal features. By way of example, the side portions can include outward facing side surfaces 126. Step 550 includes forming a solderable material on portions of the conductive substrate including exposed portions of the thick terminal features. In some embodiments, the solderable material can be conductive layer 26 and the exposed portions of the conductive substrate include outward facing side surfaces 126, and can also include one or more of lower surfaces 125 of leads 12 and lower surface 110 of pad 11. Step 560 includes singulating the encapsulated subassembly to provide package electronic devices having thick terminal features with enhanced wettable flanks. In accordance with the present embodiment, the wettable flanks comprise outward facing side surfaces 126 having conductive layer 26 disposed thereon, which have an increased height and thus an increased surface area for bonding compared to related devices.

Figure 6:
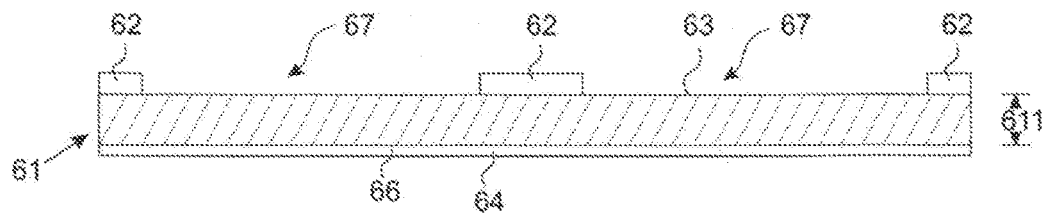
FIGS. 6-28 illustrate cross-sectional views of packaged electronic devices at various stages of fabrication in accordance with the present description.

Turning now to FIGS. 6-13, which illustrate cross-sectional views of packaged electronic devices at various stages of fabrication, the method of FIG. 5 will be further described in accordance with a first embodiment. In the present embodiment, step 510 of FIG. 5 is illustrated in FIGS. 6-9. In FIG. 6 a substrate 61, such as a conductive substrate 61 is provided. In some embodiments, substrate 61 comprises a generally flat plate of copper, a copper alloy, nickel-iron-cobalt alloys, iron-nickel alloys (e.g., Alloy 42), plated materials, or other materials known to those skilled in the art. In accordance with the present embodiment, substrate 61 has thickness 611 that is greater than substrates used for related devices to provide outward facing side surfaces 126 with increased height for enhanced wettable flank surfaces. In accordance with the present embodiment, thickness 61 can be 225 microns or more, such as about 250 microns, compared to related devices where the substrate thickness is less than 200 microns. In one embodiment, a masking layer 62 is provided on a major surface 63 of substrate 61, and a masking layer 64 is provided on a major surface 66 of substrate 61. Masking layer 62 includes openings 67 that expose portions of major surface 63 for additional processing. In some embodiments, masking layer 64 is provided without openings. Masking layers 62 and 64 can comprise photosensitive materials, such as photoresist materials, polymer materials, dielectric materials, or other masking materials known to those skilled in the art.

Figure 7:
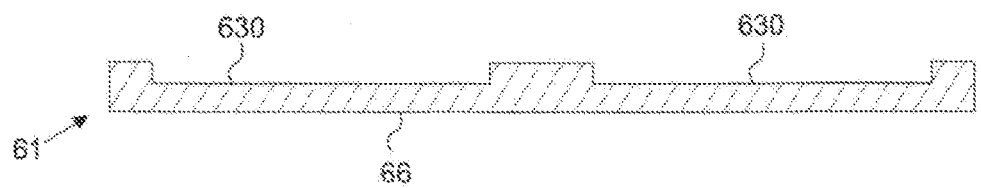

FIG. 7 illustrates substrate 61 after additional processing. In one embodiment, portions of substrate 61 are removed extending inward from major surface 63 through openings 67 to provide recessed surfaces 630. In some embodiments, a heated spray etch apparatus is used to form recessed surfaces 630. In some embodiments, masking layers 62 and 64 are the removed and substrate 61 is rinsed and dried for further processing.

Figure 8:
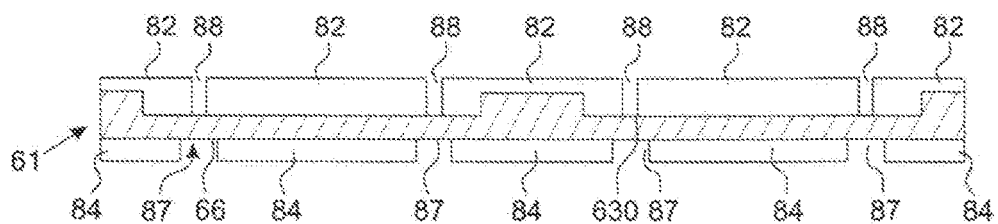
Figure 9:
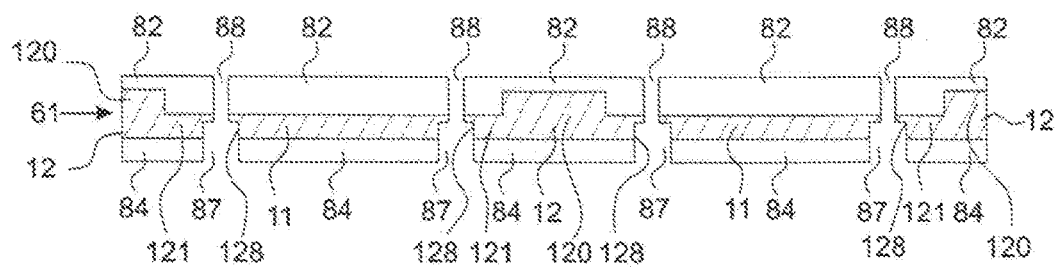

FIG. 8 illustrates substrate 61 after masking layers 82 and 84 are disposed on major surfaces 63, 630, and 66 of substrate 61. Masking layers 82 and 84 can be photoresist layers patterned to provide openings 87 and 88 that expose portions of major surface 66 and recessed surface 630 respectively as generally illustrated in FIG. 8. In accordance with the present embodiment, openings 87 are wider than openings 88. In a subsequent step, exposed portions of substrate 61 are then removed to provide leads 12 and pads 11 as generally illustrated in FIG. 9. In accordance with the present embodiment, leads 12 are provided with thick terminal portions 120 and thin terminal portions 121. Further, this step provides thin terminal portions 121 with inward facing recessed surfaces 128.

In some embodiments, an etching process is used to remove the exposed portions of substrate 61 in openings 87 and 88. Masking layers 82 and 84 can then be removed and substrate 62 can be rinsed and dried for additional processing. Those skilled in the art will appreciate that the edges of the etched features of substrate 61 may not be straight lines, but can be rounded or scalloped in cross-sectional view. In other embodiments, the features of substrate 61 can be formed using stamping techniques, chemical stamping techniques, laser cutting techniques, grinding techniques or other techniques as known to those skilled in the art including in combination with chemical etching. Although not shown, the elements of substrate 61 are typically held together using tie bars and surrounding frame structures for additional processing. In accordance with the present embodiment, substrate 61 is configured as a conductive leadframe substrate.

Figure 10:
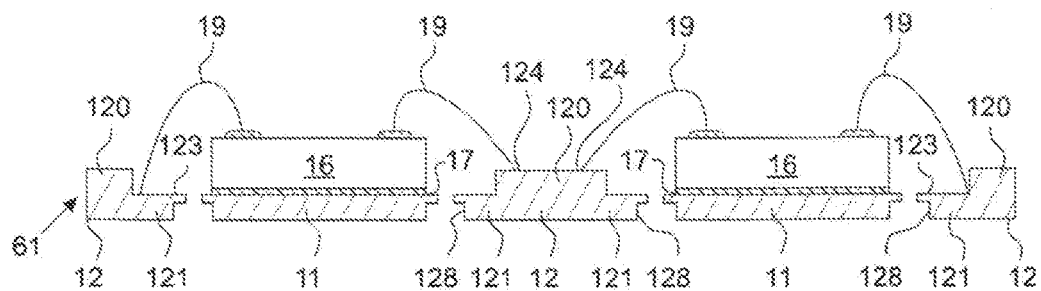

FIG. 10 illustrates substrate 61 after electronic devices 16, such as semiconductor devices 16, are electrically connected to portions of substrate 61 in accordance with step 520 of FIG. 5. In one embodiment, electronic devices 16 are attached to pads 11 using attach material 17 described previously. Conductive connective structures 19 can then be attached to electronic devices 16 and leads 12. As set forth previously, conductive connective structures 19 can be attached to either top surface 124 of thick terminal portions 120, or to top surface 123 of thin terminal portion 121, or combinations thereof can be used. It is understood that other types of conductive connective structures 19 can be used, such as clips and/or ribbon bonds in any combination including combinations with conductive wire bonds. In addition, in step 520 electronic devices 16 can be attached to pads 11 and leads 12 in a flip-chip configuration as described in FIG. 3.

Figure 11:
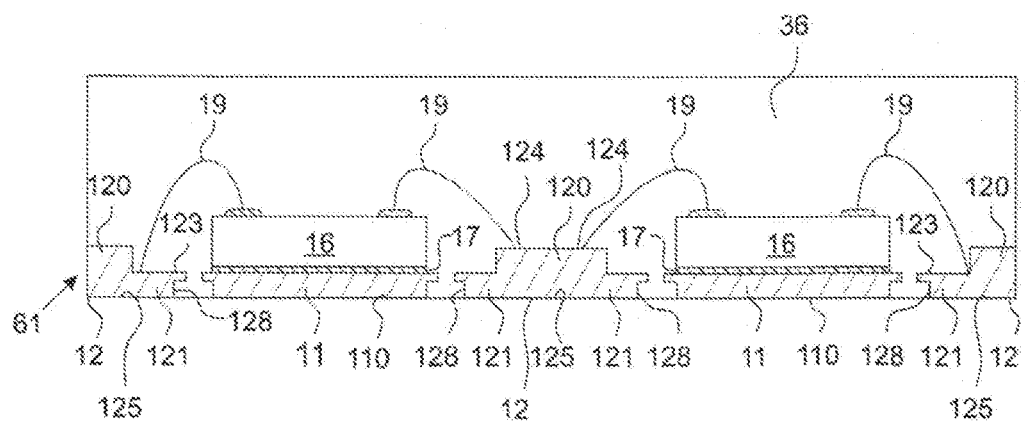

FIG. 11 illustrates substrate 61 after forming package body 36 in accordance with step 530 of FIG. 5. In one embodiment, package body 36 is provided to encapsulate electronic devices 16, conductive connective structures 19, portions of leads 12, and portions of die pads 11 to provide an encapsulated subassembly 531. In the present embodiment, lower surfaces 110 of die pads 11 and lower surfaces 125 of leads 12 are exposed to the outside of package body 36. As set forth previously, package body 36 can be polymer based composite material, such as epoxy resin with filler, epoxy acrylate with filler, or polymer with proper filler. Package body 36 comprises a non-conductive and environmentally protective material that protects electronic device 16 from external elements and contaminants. Package body 36 may be formed using paste printing, compressive molding, transfer molding, over-molding, liquid encapsulant molding, vacuum lamination, other suitable applicator, or other processes as known to those of skill in the art. In some embodiments, package body 36 is an EMC, and can be formed using transfer or injection molding techniques.

Figure 12:
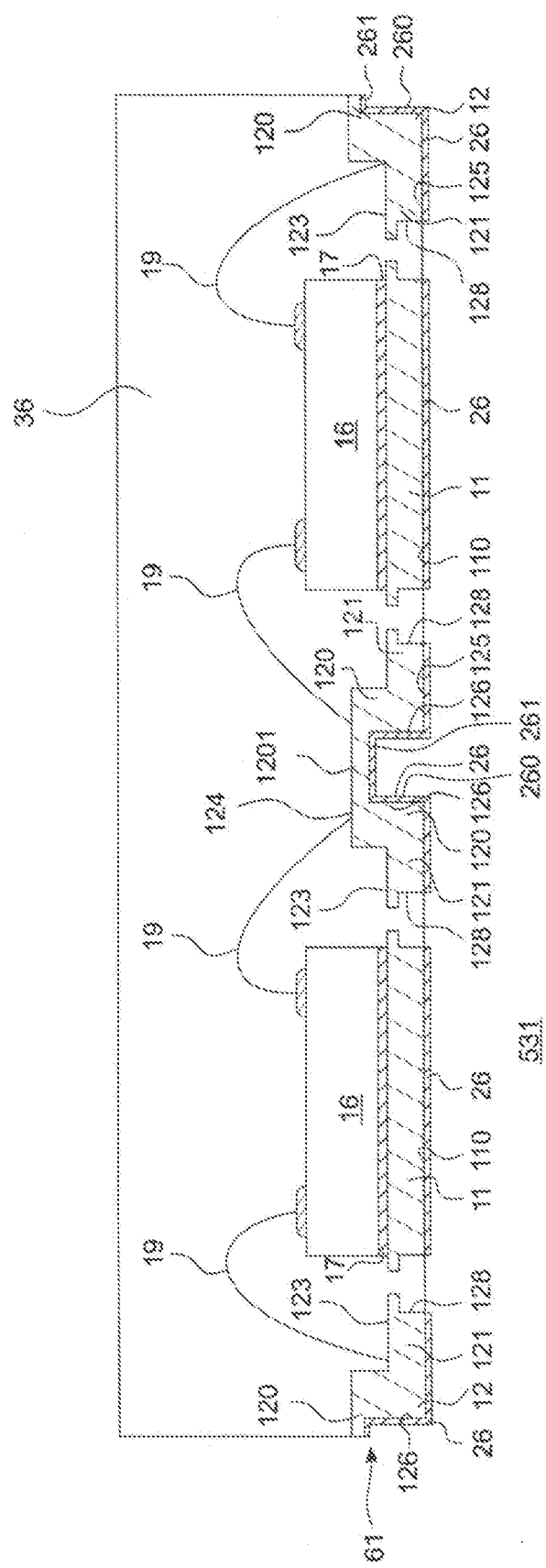

FIG. 12 illustrates encapsulated subassembly 531 after exposing portions of thick terminal portions 120 of leads 12 including outward facing side surfaces 126 in accordance with step 540 of FIG. 5. In one embodiment, a partial sawing process is used to remove a portion of thick terminal portions 120 of leads 12 extending inward from lower surfaces 125. In one embodiment, the sawing process does not extend all the way through thick terminal portions 120 so that adjoining thick terminal portions 120 in adjacent units remain physically connected as illustrated in FIG. 12 by element 1201. This physical connection facilitates electrical communication for an electroplating process to form conductive layer 26 on outward facing side surfaces 126. In other embodiments, other removal techniques are used instead of or in combination with the sawing process. By way of example, etching, grinding, and/or laser removal processes can be used as well as other removal processes known to those skilled in the art.

Next, in some embodiments encapsulated subassembly 531 can be attached to a belt finger portion of an electroplating apparatus, which suspends the subassembly within a plating solution to form conductive layers 26 on exposed portions of substrate 61, including outward facing side surfaces 126 of thick terminal portions 120, lower surfaces 125 of leads 12, and lower surfaces 110 of pads 11 in accordance with step 550 of FIG. 5. In accordance with the present embodiment, conductive layer 26 includes vertical portions 260 and horizontal portions 261 on thick terminal portions 120. Conductive layer 26 can be solderable materials, such as tin, cadmium, gold, silver, palladium, rhodium, copper, copper alloys, combinations thereof, or similar materials known to those skilled in the art. In some embodiments, a nickel barrier layer can be used before plating the solderable materials. In some embodiments, conductive layer 26 can have a thickness in a range from about 2 microns to about 20 microns.

Figure 13:
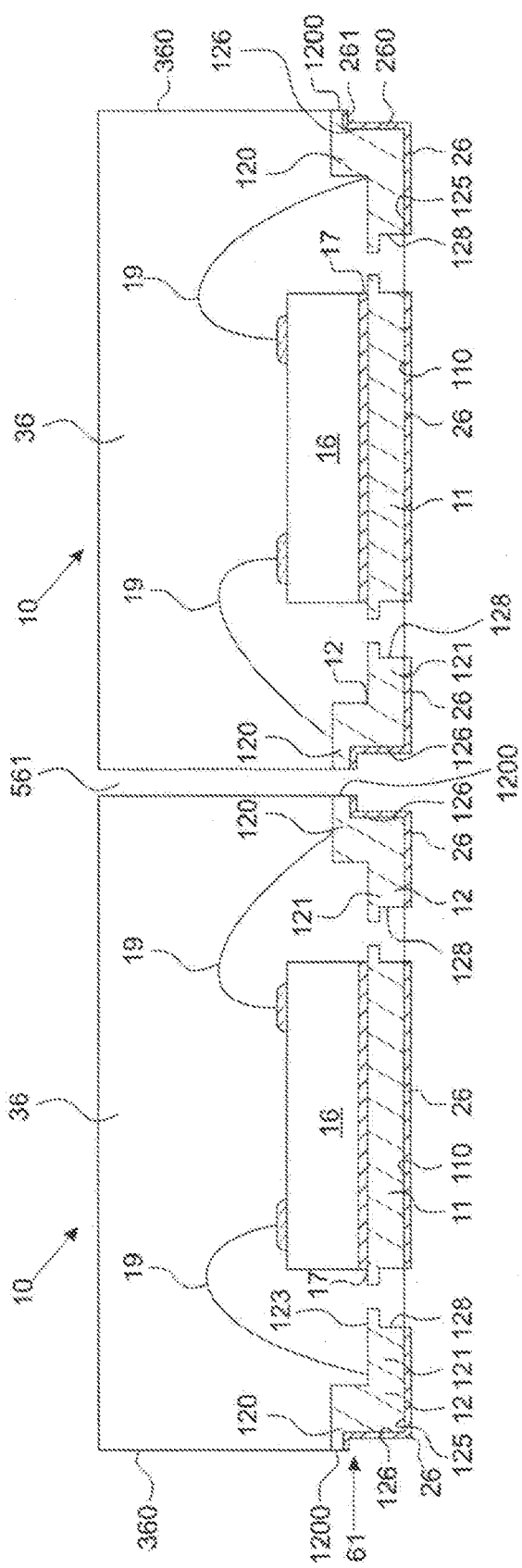

FIG. 13 illustrates encapsulated subassembly 531 after a singulation step to separate the subassembly into individual packaged electronic devices 10 in accordance with step 560 of FIG. 5. In some embodiments, a sawing process can be used to singulate the individual devices along singulation line 561, which forms side surfaces 360 of package bodies 36 and portions 1200 of leads 12 that are absent conductive layer 26. This step provides individual packaged electronic devices 10 each having outward facing side surfaces 126 that are recessed and provided with conductive layers 126 configured to provide increased surface area or enhanced wettable flanks for attaching packaged electronic devices 10 to a next level of assembly, such as a printed circuit board 200 as illustrated in FIG. 2.

Figure 14:
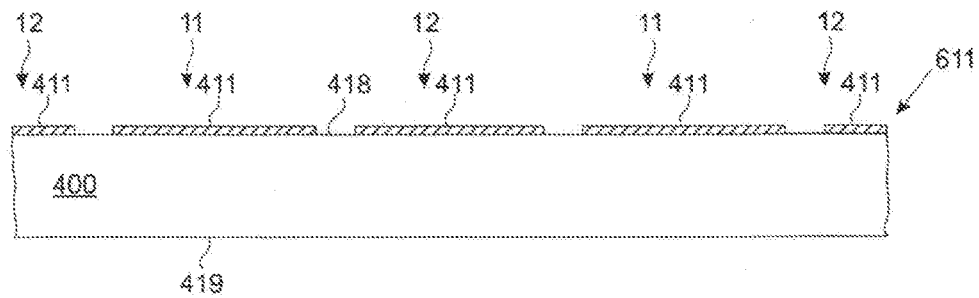
Figure 15:
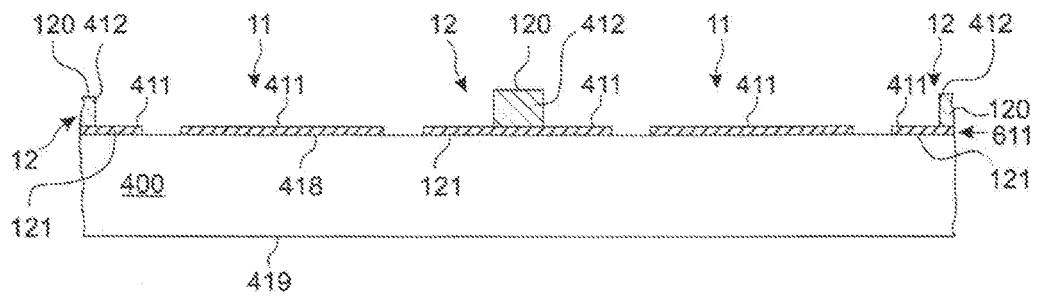

Turning now to FIGS. 14-20, which illustrate cross-sectional views of packaged electronic devices at various stages of fabrication, the method of FIG. 5 will be further described in accordance with another embodiment. In the present embodiment, step 510 of FIG. 5 of providing a conductive substrate is illustrated in FIGS. 14-15. In FIG. 14, a conductive pattern 411 is formed on a first surface 418 of a carrier 400. Carrier 400 further includes a second surface 419 that is opposite to the first surface 418. In one embodiment, carrier 400 has a thickness in a range from approximately 3 microns through 300 microns. In some embodiments, carrier 400 may be formed of one or more of a metal, silicon, glass, an epoxy resin or other materials known to those skilled in the art. At least the first surface 418 is prepared and cleaned for receiving the first conductive pattern 411.

In one embodiment, conductive pattern 411 may be made of a conductive material comprising copper (Cu), gold (Au), silver (Ag), aluminum (Al) or other materials as known to those skilled in the art. In addition, conductive pattern 411 may be formed by physical vapor deposition (PVD), chemical vapor deposition (CVD), metal sputtering, metal evaporation, electrolytic or electroless plating or other formation techniques known to those skilled in the art. In some embodiments, conductive pattern 411 has a thickness in a range from approximately 3 microns through 50 microns. After deposition, the conductive material may be patterned by physical etching or chemical etching, or other techniques known to those skilled in the art. In other embodiments, a masking layer (not shown) may be first deposited on the first major surface 418 and the conductive material subsequently deposited. The masking layer may or may not be removed after the conductive pattern is formed depending on the application. In accordance with the present embodiment, conductive pattern 411 forms portions of leads 12 and pads 11 for a substrate 611. In some embodiments, portions of conductive pattern 411 can be referred to as conductive traces 411 or traces 411.

Next, referring to FIG. 15, conductive pillars 412 are provided on portions of conductive pattern 411 that will be used as leads 12 of substrate 611. Conductive pillars 412 are formed to extend away or outward from conductive pattern 411 and away from first surface 418 of carrier 400. In one embodiment, conductive pillars 412 are preferably formed of a material having good electrical, thermal conductivity, such as copper (Cu), a copper alloy or similar materials as known to those skilled in the art. In some embodiments, conductive pillars 412 have a thickness in a range from approximately 30 microns through 300 microns. In addition, conductive pillars 412 may be formed using PVD, CVD, metal sputtering, metal evaporation, electrolytic or electroless plating or other formation techniques as known to those of skill in the art. Photomasking and etch techniques can be used to form conductive pillars 412 in desired shapes, such as cuboid shapes. In one embodiment, electrolytic or electroless plating techniques are used with a masking layer provided over the first major surface 418 and having a preselected pattern for forming the first conductive pillars 412 in desired locations on conductive pattern 411. In accordance with the present embodiment, conductive pillars 412 have a narrower width than conductive pattern 411 where conductive pillars 412 are formed. In accordance with the present embodiment, conductive pillars 412 (and those portions of conductive pattern 411 disposed below conductive pillars 412) are configured to provide thick terminal portions 120 of leads 12, and those portions of conductive pattern 411 adjacent to, but not covered by, conductive pillars 412 are configured to provide thin terminal portions 121 of leads 12. Those portions of conductive pattern 411 not provided with conductive pillars are configured to provide pads 11. In accordance with the present embodiment, substrate 611 is configured as a build-up substrate. From this point forward in the description of FIGS. 16-20, leads 12 and pads 11 designations will be used with substrate 611.

Figure 16:
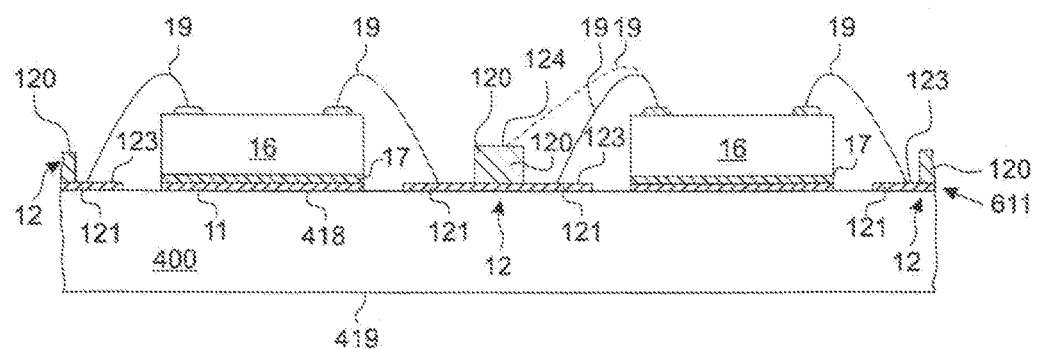

FIG. 16 illustrates substrate 611 after electronic devices 16 are electrically connected to portions of substrate 611 in accordance with step 520 of FIG. 5. In one embodiment, electronic devices 16 are attached to pads 11 using attach material 17 described previously. Conductive connective structures 19 can then be attached to electronic devices 16 and leads 12. As set forth previously, conductive connective structures 19 can be attached to either top surface 124 of thick terminal portions 120, or to top surface 123 of thin terminal portion 121, or combinations thereof can be used. It is understood that other types of conductive connective structures 19 can be used, such as clips and/or ribbon bonds in any combination including combinations with conductive wires. In addition, in step 520 electronic devices 16 can be attached to pads 11 and leads 12 in a flip-chip configuration as described in FIG. 3.

Figure 17:
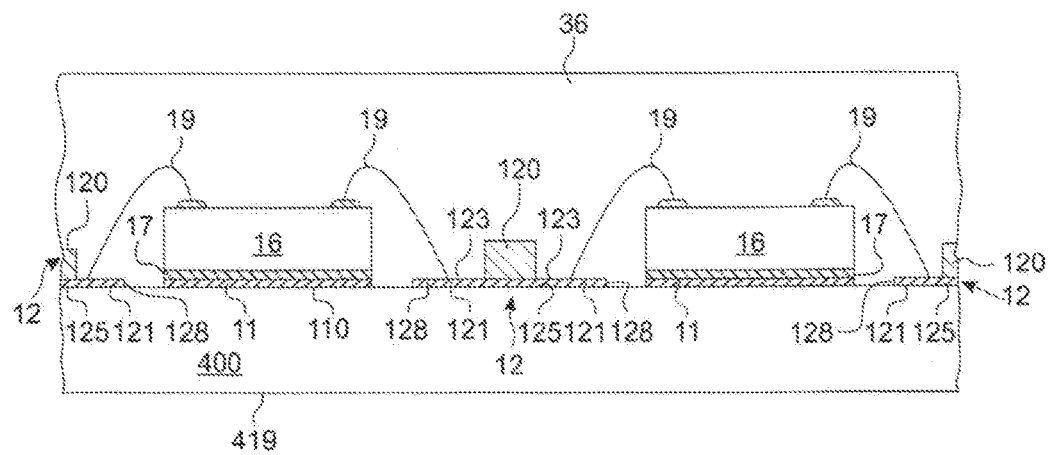

FIG. 17 illustrates substrate 611 after forming package body 36 in accordance with step 530 of FIG. 5. In one embodiment, package body 36 is provided to encapsulate electronic devices 16, conductive connective structures 19, portions of leads 12, and portions of die pads 11 to provide an encapsulated subassembly 531. In the present embodiment, lower surfaces 110 of die pads 11 and lower surfaces 125 of leads 12 are exposed to the outside of package body 36 adjoining major surface 418 of carrier 400.

Figure 18:
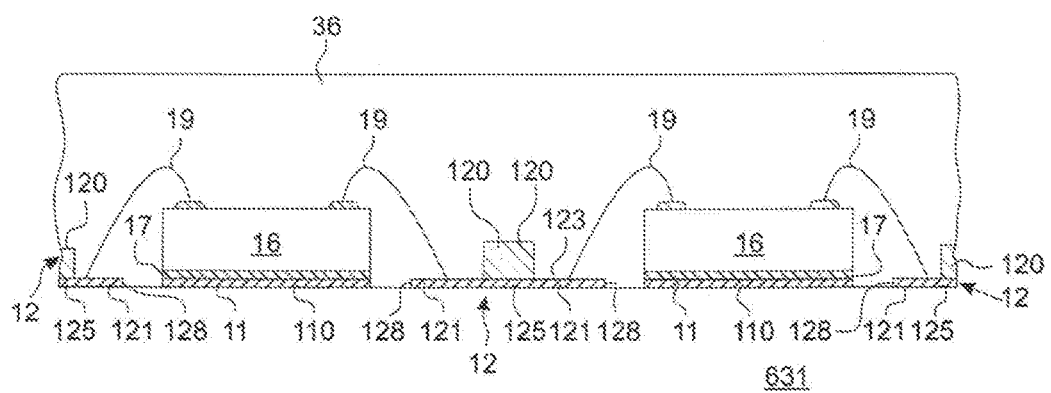

Package body 36 can be the same materials and can formed using the same processes as described previously and the description will not be repeated again here. Carrier 400 can then be removed to provide an encapsulated subassembly 631 as illustrated in FIG. 18.

Figure 19:
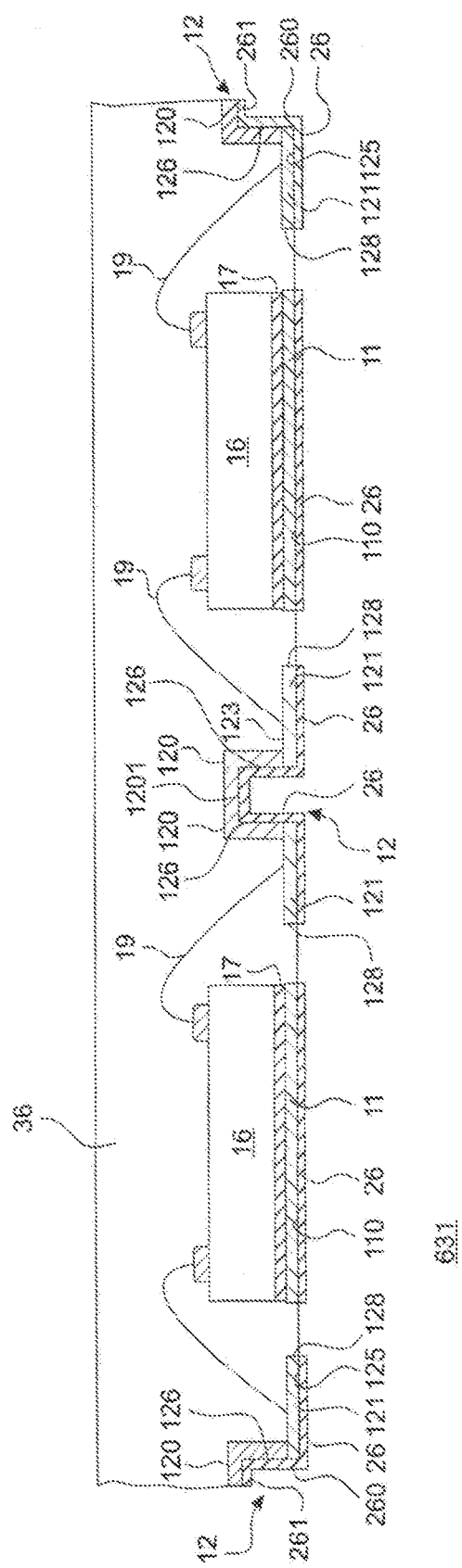

FIG. 19 illustrates encapsulated subassembly 631 after exposing portions of thick terminal portions 120 of leads 12 including outward facing side surfaces 126 in accordance with step 540 of FIG. 5. In one embodiment, a partial sawing process is used to remove a portion of thick terminal portions 120 of leads 12 extending inward from lower surfaces 125. In one embodiment, the sawing process does not extend all the way through thick terminal portions 120 so that adjoining thick terminal portions 120 in adjacent units remain physically connected as illustrated in FIG. 19 by element 1201. This physical connection facilitates electrical communication for an electroplating process to form conductive layer 26 on outward facing side surfaces 126. In other embodiments, other removal techniques are used instead of or in combination with the sawing process. By way of example, etching, grinding, and/or laser removal processes can be used as well as other removal processes known to those skilled in the art.

Next, in some embodiments encapsulated subassembly 631 can be attached to a belt finger portion of an electroplating apparatus, which suspends the subassembly within a plating solution to form conductive layers 26 on exposed portions of substrate 61, including outward facing side surfaces 126 of thick terminal portions 120, lower surfaces 125 of leads 12, and lower surfaces 110 of pads 11 in accordance with step 550 of FIG. 5. In accordance with the present embodiment, conductive layer 26 includes vertical portions 260 and horizontal portions 261 on thick terminal portions 120. Conductive layer 26 can be the same materials as described previously and the description will not repeated again here.

Figure 20:
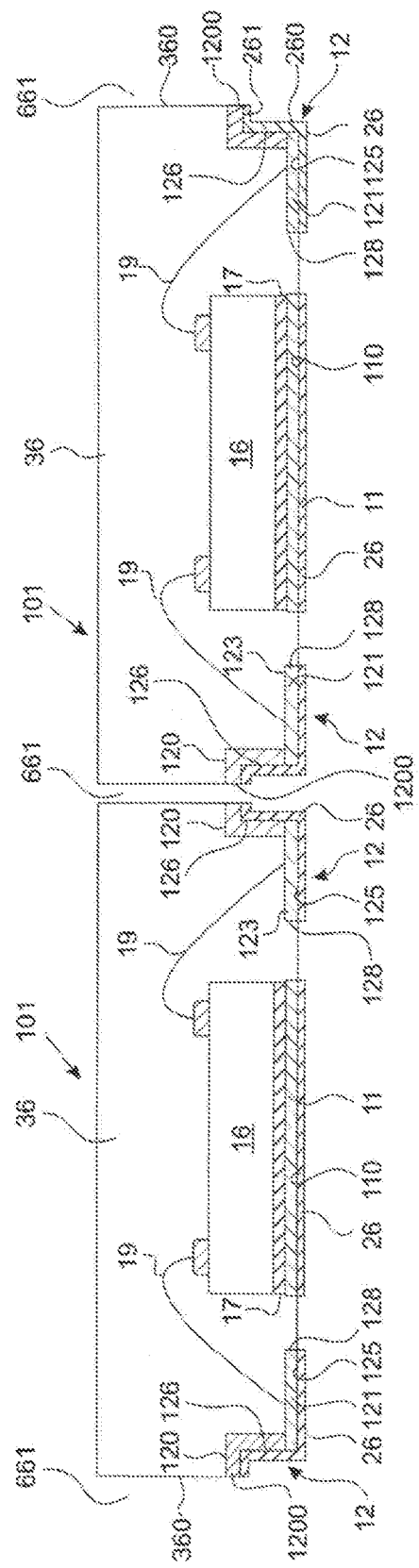

FIG. 20 illustrates encapsulated subassembly 631 after a singulation step to separate the subassembly into individual packaged electronic devices 101 in accordance with step 560 of FIG. 5. In some embodiments, a sawing process can be used to singulate the individual devices along singulation lines 661, which forms side surfaces 360 of package bodies 36 and portions 1200 of leads 12 that are absent conductive layer 26. This step provides individual packaged electronic devices 101 each having outward facing side surfaces 126 that are recessed and provided with conductive layers 126 configured to provide increased surface area or enhanced wettable flanks for attaching packaged electronic devices 101 to a next level of assembly, such as a printed circuit board 200 as illustrated in FIG. 2.

Figure 21:
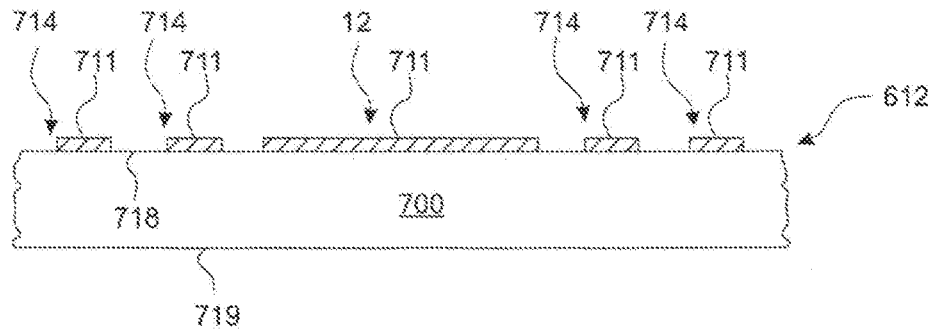

Turning now to FIGS. 21-28, which illustrate cross-sectional views of packaged electronic devices at various stages of fabrication, the method of FIG. 5 will be further described in accordance with a further embodiment. In the present embodiment, step 510 of FIG. 5 of providing a conductive substrate is illustrated in FIGS. 21-25. In FIG. 21, a conductive pattern 711 is formed on a first surface 718 of a carrier 700. Carrier 700 further includes a second surface 719 that is opposite to the first surface 718. In one embodiment, carrier 700 has a thickness in a range from approximately 3 microns through 300 microns. In some embodiments, carrier 700 may be formed of one or more of a metal, silicon, glass, an epoxy resin or other materials known to those skilled in the art. At least the first surface 718 is prepared and cleaned for receiving the first conductive pattern 711.

In one embodiment, conductive pattern 711 may be made of a conductive material comprising copper (Cu), gold (Au), silver (Ag), aluminum (Al) or other materials as known to those skilled in the art. In addition, conductive pattern 711 may be formed by PVD, CVD, metal sputtering, metal evaporation, electrolytic or electroless plating or other formation techniques known to those skilled in the art. In some embodiments, conductive pattern 711 has a thickness in a range from approximately 3 microns through 50 microns. After deposition, the conductive material may be patterned by physical etching or chemical etching, or other techniques known to those skilled in the art. In other embodiments, a masking layer (not shown) may be first deposited on the first major surface 718 and the conductive material subsequently deposited. The masking layer may or may not be removed after the conductive pattern is formed depending on the application. In accordance with the present embodiment, conductive pattern 711 forms portions of leads 12 and traces 714 for a substrate 612.

Figure 22:
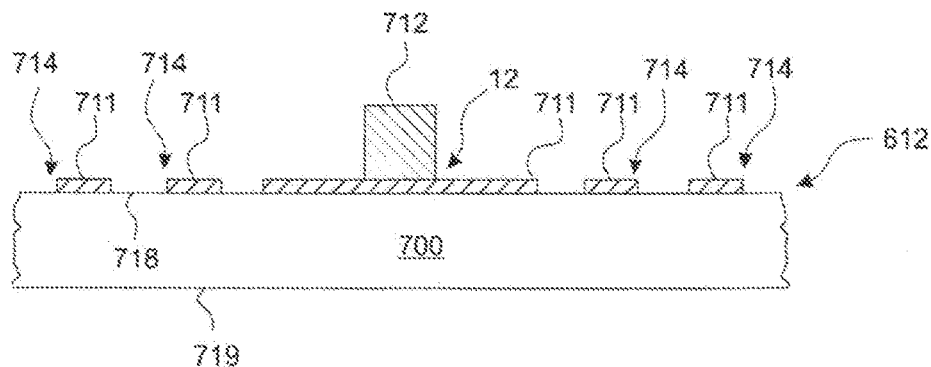

Next, referring to FIG. 22, a conductive pillar 712 is provided on a portion of conductive pattern 711 that will be used for leads 12 of substrate 612. Conductive pillar 712 is formed to extend away or outward from conductive pattern 711 and away from first surface 718 of the carrier 700. In one embodiment, conductive pillar 712 is preferably formed of a material having good electrical, thermal conductivity, such as copper (Cu), a copper alloy or similar materials as known to those skilled in the art. In one embodiment, conductive pillars 712 have a thickness in a range from approximately 30 microns through 300 microns. In addition, conductive pillars 712 may be formed using PVD, CVD, metal sputtering, metal evaporation, electrolytic or electroless plating or other formation techniques as known to those of skill in the art. Photomasking and etch techniques can be used to form conductive pillars 712 in desired shapes, such as cuboid shapes. In one embodiment, electrolytic or electroless plating techniques are used with a masking layer provided over the first major surface 718 and having a preselected pattern for forming the first conductive pillars 712 in desired locations on conductive pattern 711. In accordance with the present embodiment, conductive pillar 712 has a narrower width than conductive pattern 711 where conductive pillar 712 is formed. In accordance with the present embodiment, conductive pillar 712 (and that portion of conductive pattern 711 disposed below conductive pillar 712) is configured to provide thick terminal portions 120 of leads 12, and those portions of conductive pattern 711 adjacent to, but not covered by, conductive pillar 712 are configured to provide thin terminal portions 121 of leads 12. In accordance with the present embodiment, substrate 612 is configured as a molded substrate. From this point forward in the description of FIGS. 23-28, lead 12 and traces 714 designations will be used with substrate 612.

Figure 23:
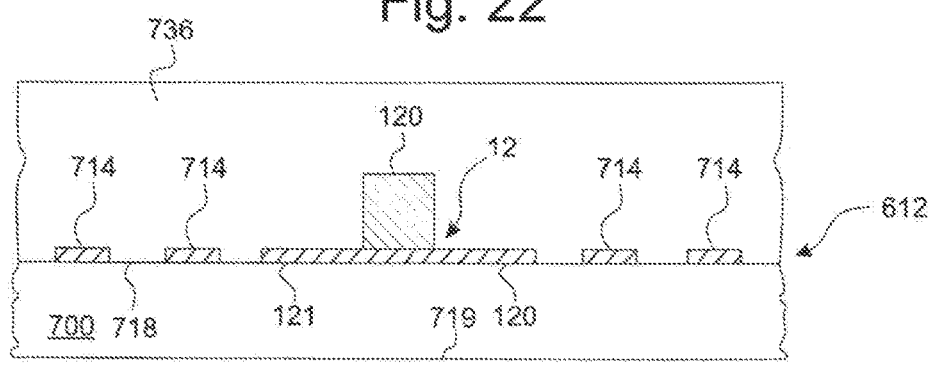
Figure 24:
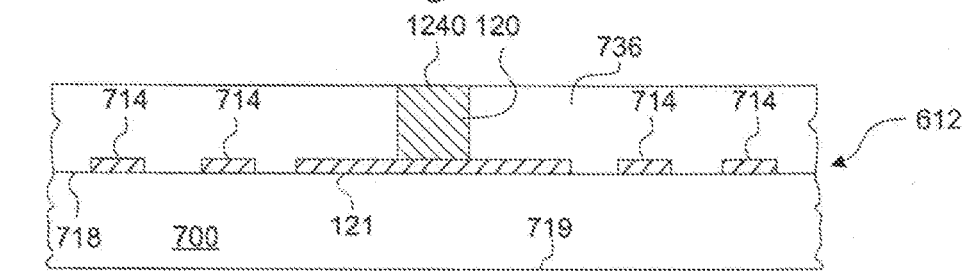

FIG. 23 illustrates substrate 612 after additional processing. In one embodiment, substrate 612 is encapsulated with a molded layer 736 that covers or encapsulates lead 12, traces 714, and exposed portions of carrier 700. Molded layer 736 can be polymer based composite material, such as epoxy resin with filler, epoxy acrylate with filler, or polymer with proper filler. Molded layer 736 may be formed using paste printing, compressive molding, transfer molding, overmolding, liquid encapsulant molding, vacuum lamination, other suitable applicator, or other processes as known to those of skill in the art. In some embodiments, molded layer 736 is an EMC, and can be formed using transfer or injection molding techniques. In one embodiment, molded layer 736 is provided to extend over the top of thick terminal portion 120 of lead 12. In a subsequent step, a portion of molded layer 736 can be removed to expose an outer surface 1240 of thick terminal portion 120 of lead 12 as illustrated in FIG. 24. In some embodiments, portions of molded layer 736 can be removed using grinding techniques, etching techniques, combination thereof, or other removal techniques known to those skilled in the art. In other embodiments, molded layer 736 can be as-formed with the top surface of thick terminal portion 120 exposed by placing an upper mold plate adjacent to thick terminal portion 120 during the molding process. In the alternative, film-assisted molding can be used.

Figure 25:
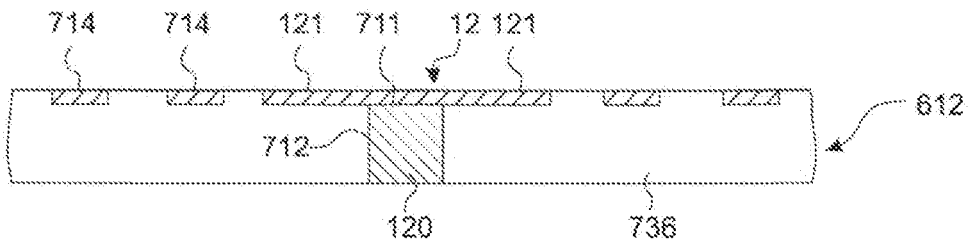

FIG. 25 illustrates substrate 612 after carrier 700 is removed to expose traces 714 and leads 12 to the outside for further processing. In accordance with the present embodiment, substrate 612 is configured as a molded substrate and has been flipped or rotated 180 degrees from FIG. 24.

Figure 26:
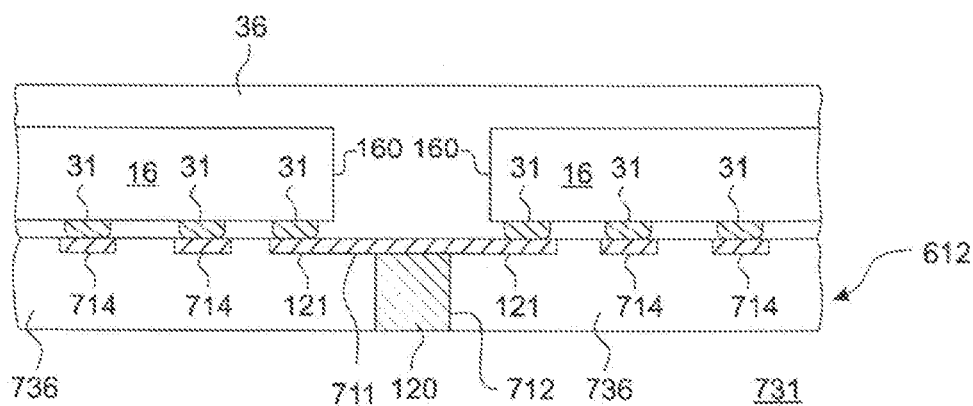

FIG. 26 illustrates substrate 612 after electronic devices 16 are electrically connected to portions of substrate 612 in accordance with step 520 of FIG. 5. In one embodiment, electronic devices 16 are attached in a flip-chip configuration to traces 714 and leads 12 using conductive bumps 31. In some embodiments, conductive bumps 31 temperature reflowed solder bumps, thermosonic or thermocompression bonded bumps (e.g., gold bumps), adhesively bonded bumps, or other bump materials as known to those skilled in the art. In some embodiments, conductive bumps are first applied to bond pads (not shown) on electronic devices 16 while in wafer form. In one embodiment, electronic device 16 is attached to lead 12 such that a peripheral edge 160 of electronic die 16 extends to only overlap thin terminal portion 121. In other embodiments, electronic device 16 is attached to lead 12 such that peripheral edge 160 of electronic die 16 extends to overlap at least a portion of thick terminal portion 120. In some embodiments, package body 36 provides an underfill structure for electronic device 16. In additional embodiments, a separate underfill material can be used and can be formed prior to forming package body 36.

FIG. 26 further illustrates substrate 612 after forming package body 36 in accordance with step 530 of FIG. 5. In one embodiment, package body 36 is provided to encapsulate electronic devices 16, portions of leads 12, and portions of traces 714 provide an encapsulated subassembly 731. Package body 36 can be the same materials and can formed using the same processes as described previously and the description will not be repeated again here.

Figure 27:
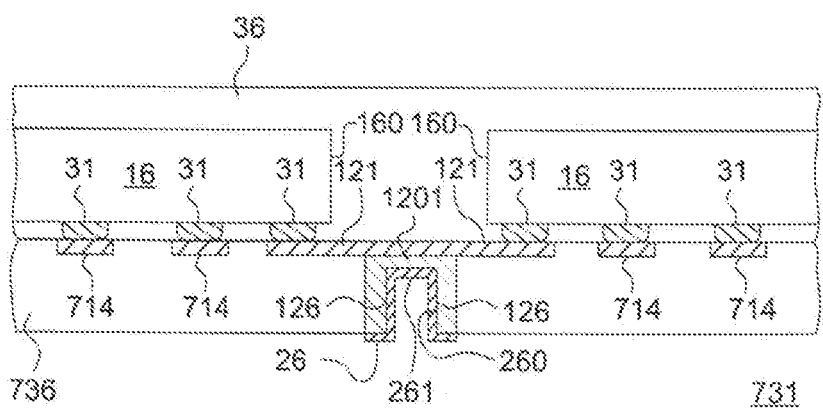

FIG. 27 illustrates encapsulated subassembly 731 after exposing portions of thick terminal portions 120 of leads 12 including outward facing side surfaces 126 in accordance with step 540 of FIG. 5. In one embodiment, a partial sawing process is used to remove a portion of thick terminal portions 120 of leads 12 extending inward from outer surface 1240 of thick terminal portions 120. In one embodiment, the sawing process does not extend all the way through thick terminal portions 120 so that adjoining thick terminal portions 120 in adjacent units remain physically connected as illustrated in FIG. 27 by element 1201. This physical connection facilitates electrical communication for the electroplating process to form conductive layer 26 on outward facing side surfaces 126. In another embodiment, the removal process completely separates the conductive pillar 712 portion of lead 12, but terminates proximate to underlying conductive pattern 711 so that conductive pattern 711 remains intact (i.e., conductive pattern 711 provides element 1201) to facilitate electrical communication for the electroplating process to form conductive layer 26. In other embodiments, other removal techniques are used instead of or in combination with the sawing process. By way of example, etching, grinding, and/or laser removal processes can be used as well as other removal processes known to those skilled in the art.

Next, in some embodiments encapsulated subassembly 731 can be attached to a belt finger portion of an electroplating apparatus, which suspends the subassembly within a plating solution to form conductive layers 26 on exposed portions of thick terminal portions 120 in accordance with step 550 of FIG. 5. In accordance with the present embodiment, conductive layer 26 includes vertical portions 260 and horizontal portions 261 on thick terminal portions 120. Conductive layer 26 can be the same materials as described previously and the description will not repeated again here.

Figure 28:
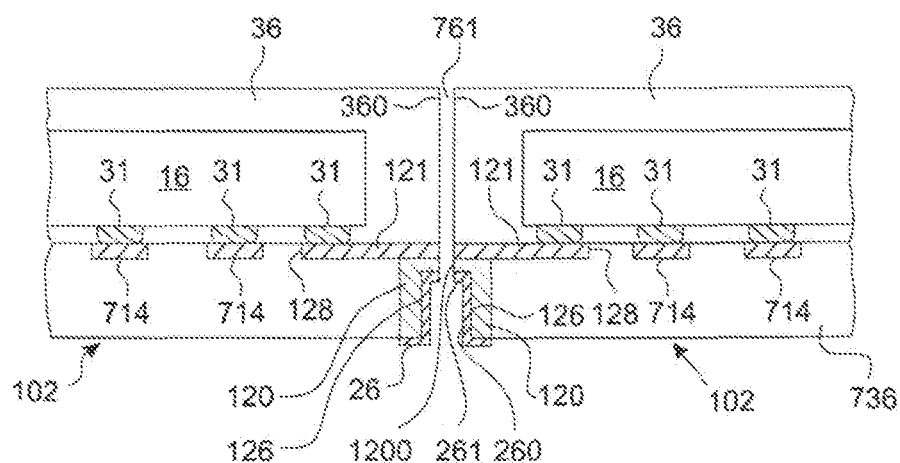

FIG. 28 illustrates encapsulated subassembly 731 after a singulation step to separate the subassembly into individual packaged electronic devices 102 in accordance with step 560 of FIG. 5. In some embodiments, a sawing process can be used to singulate the individual devices along singulation lines 761, which forms side surfaces 360 of package bodies 36 and portions 1200 of leads 12 that are absent conductive layer 26. This step provides individual packaged electronic devices 102 each having outward facing side surfaces 126 that are recessed and provided with conductive layers 126 configured to provide increased surface area or wettable flanks for attaching packaged electronic devices 102 to a next level of assembly, such as a printed circuit board 200 as illustrated in FIG. 2.

Figure 29:
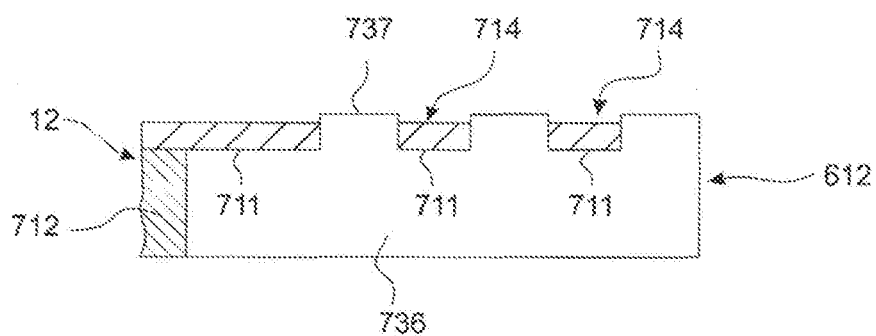
FIG. 29 illustrates a partial cross-sectional view of an alternative embodiment of a substrate in accordance with the present description.

FIG. 29 illustrates a partial cross-sectional view of substrate 612 in accordance with an alternative embodiment. In the present embodiment, conductive pattern 711 is recessed below a major surface 737 of molded layer 736. The recessed surfaces can be formed using, for example, masking and etching techniques. One advantage of providing conductive pattern 711 as recessed is that it can facilitate alignment of electronic device 16 to substrate 612.

In view of all of the above, it is evident that a novel structure and method of providing the structure has been disclosed that includes a lead structure having an outwardly facing side surface with enhanced surface area for providing a wettable flank. More particularly, the outward facing side surface has an increased height for receiving a solderable layer compared to related devices. In some embodiments the lead structure includes a thick terminal portion that has the outwardly facing side surface and a thin terminal portion having an inwardly facing side surface that is absent the solderable layer. An electronic device can be electrically connected to either the thick terminal portion or the thin terminal portion. The lead structure can be provided as part of, for example, a lead frame structure, a build-up substrate structure, or a molded substrate structure. The exposed side surface provides an enhanced wettable flank surface that improves the bond integrity when the packaged electronic device is attached to a next level of assembly, such as a printed circuit board. In addition, the increased height enhances optical inspection of solder joints formed between the packaged electronic device and the next level of assembly. The structure and method provide for improved reliability by facilitating stronger solder joints compared to previous approaches.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. By way of example, multiple electronic devices can be attached to a substrate in side-by-side configurations, in stacked configurations, combinations thereof, or other configurations known to those skilled in the art. In addition, the packaged electronic device can leads on less than all sides of the package body.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method for forming a packaged electronic device comprising:
   providing a substrate comprising:
      a lead comprising:
         a first terminal portion having a first thickness; and
         a second terminal portion having an inward facing side surface having a second thickness that is less than the first thickness;
   electrically coupling an electronic device to the lead;
   providing a package body encapsulating the electronic device and portions of the lead;
   removing a first portion of the first terminal portion to provide an outward facing side surface of the lead;
   forming a conductive layer on the outward facing side surface of the lead; and
   singulating a second portion of the first terminal portion, wherein:
      providing the substrate comprises:
         providing a carrier having a first major surface and a second major surface opposite to the first major surface;
         providing a conductive pattern on the first major surface; and
         providing a conductive pillar on a first portion of the conductive pattern but not on a second portion of the conductive pattern, wherein the conductive pillar and the first portion of the conductive pattern provide the first terminal portion and the second portion of the conductive pattern provides the second terminal portion.

2. The method of claim 1, wherein:
   providing the substrate comprises providing a pad, wherein the second terminal portion is proximate to the pad and the first terminal portion is distal to the pad;

removing the first portion of the first terminal portion comprises forming the outward facing side surface comprising an outward facing recessed side surface; and forming the conductive layer comprises forming the conductive layer on a vertical portion and a horizontal portion of the outward facing recessed side surface.

3. The method of claim 1, wherein:
providing the substrate comprises providing the conductive pattern with a pad;
the method further comprises attaching the electronic device to the pad; and
the method further comprises removing the carrier after forming the package body.

4. The method of claim 1, wherein:
providing the substrate comprises providing the conductive pattern with a pad;
the method further comprises forming a molded layer covering portions of the conductive pillar, the second portion of the conductive pattern, and the pad;
the method further comprises removing the carrier before electrically coupling the electronic device to the lead to expose the conductive pattern to the outside of the molded layer; and
the method further comprises electrically coupling the electronic device to the pad.

5. The method of claim 4, wherein electrically coupling the electronic device comprises attaching the electronic device to the lead and the pad in a flip-chip configuration.

6. The method of claim 4, further comprising recessing surfaces of the conductive pattern below a major surface of the molded layer.

7. The method of claim 1, wherein electrically coupling the electronic device to the lead comprises electrically connecting the electronic device using a conductive connective structure attached to the second terminal portion.

8. The method of claim 1, wherein electrically coupling the electronic device to the lead comprises electrically connecting the electronic device using a conductive connective structure attached to the first terminal portion.

9. The method of claim 1, wherein singulating the second portion of the first terminal portion further defines a side surface of the package body.

10. The method of claim 1, wherein:
providing the conductive pattern comprises providing the conductive pattern having a first thickness in a range from about 3 microns through 50 microns; and
providing the conductive pillar comprises providing the conductive pillar having a second thickness in a range from about 30 microns through 300 microns.

11. A method of forming a packaged electronic device, comprising:
providing a carrier having a first major surface and a second major surface opposite to the first major surface, a conductive pattern on the first major surface, and a conductive pillar on a first portion of the conductive pattern but not on a second portion of the conductive pattern, wherein:
the conductive pillar and the first portion of conductive pattern provide a first terminal portion;
the second portion of the conductive pattern provides a second terminal portion;
the first terminal portion and the second terminal portion are configured as a lead;
the first terminal portion comprises a first thickness; and
the second terminal portion comprises an inward facing side surface having a second thickness that is less than the first thickness;
electrically coupling an electronic device to the lead;
providing a package body encapsulating the electronic device and portions of the lead;
removing a first portion of the first terminal portion to provide an outward facing side surface of the lead;
forming a conductive layer on the outward facing side surface of the lead; and
singulating a second portion of the first terminal portion.

12. The method of claim 11, wherein:
providing the carrier comprises providing the conductive pattern comprising a pad;
the method further comprises attaching the electronic device to the pad; and
the method further comprises removing the carrier after forming the package body.

13. The method of claim 11, wherein:
providing the carrier comprises providing the conductive pattern comprising a pad;
the method further comprises forming a molded layer covering portions of the conductive pillar, the second portion of the conductive pattern, and the pad;
the method further comprises removing the carrier before electrically coupling the electronic device to the lead, wherein removing the carrier exposes the conductive pattern to the outside of the molded layer; and
the method further comprises electrically coupling the electronic device to the pad.

14. The method of claim 13, wherein electronically coupling the electronic device comprises attaching the electronic device to the lead and the pad in a flip-chip configuration.

15. The method of claim 11, wherein electrically coupling the electronic device to the lead comprises electrically connecting the electronic device using a conductive connective structure attached to the first terminal portion.

16. The method of claim 11, wherein:
removing the first portion of the first terminal portion comprises forming the outward facing side surface comprising an outward facing recessed side surface;
forming the conductive layer comprises forming the conductive layer on a vertical portion and a horizontal portion of the outward facing recessed side surface; and
singulating the second portion of the first terminal portion further defines a side surface of the package body.

17. A packaged electronic device comprising:
a substrate comprising:
a conductive pattern layer;
a conductive pillar layer disposed on a first portion of the conductive pattern layer but not on a second portion of the conductive pattern layer, wherein:
the conductive pillar layer and the first portion of conductive pattern layer provide a first terminal portion and the second portion of the conductive pattern layer provides a second terminal portion;
the first terminal portion and the second terminal portion are configured as a lead;
the first terminal portion comprises a first thickness;
the second terminal portion comprises an inward facing side surface having a second thickness that is less than the first thickness; and
the first terminal portion comprises an outward facing side surface of the lead;
an electronic device electrically coupled to the lead;

a package body encapsulating the electronic device and portions of the lead; and a conductive layer disposed on the outward facing side surface of the lead.

18. The packaged electronic device of claim 17, wherein:

the conductive pattern layer further comprises a pad; and the electronic device is attached to the pad.

19. The packaged electronic device of claim 17, wherein:

the outward facing side surface of the lead comprises an outward facing recessed side surface; and the conductive layer is disposed on a vertical portion of the outward facing recessed side surface and is disposed on a horizontal portion of the outward facing recessed surface.

20. The packaged electronic device of claim 17, wherein:

the conductive pattern layer further comprises a pad;

the packaged electronic device further comprises a molded layer covering portions of the conductive pillar layer, the second portion of the conductive pattern layer, and the pad;

the conductive pillar layer comprises a bottom surface exposed to the outside of the molded layer;

the conductive layer is disposed on the bottom surface of the conductive pillar layer; and the electronic device is attached to the pad and the second terminal portion in a flip-chip configuration.

* * * * *